(12) United States Patent
Chen

(10) Patent No.: US 8,723,413 B2
(45) Date of Patent: May 13, 2014

(54) TOUCH-SENSING DISPLAY APPARATUS AND FABRICATING METHOD THEREOF

(75) Inventor: Kuang-Jung Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 1136 days.

(21) Appl. No.: 12/699,065

(22) Filed: Feb. 3, 2010

(65) Prior Publication Data

US 2010/0265206 A1    Oct. 21, 2010

(30) Foreign Application Priority Data

Apr. 21, 2009   (TW) .............................. 98113194 A

(51) Int. Cl.
*H01L 51/50*    (2006.01)

(52) U.S. Cl.
USPC .......................................... 313/504; 345/173

(58) Field of Classification Search
USPC ........................... 313/504, 512; 345/173, 174
See application file for complete search history.

(56) References Cited

U.S. PATENT DOCUMENTS

| | | | |
|---|---|---|---|
| 5,895,228 A | 4/1999 | Biebuyck et al. | |
| 5,952,778 A | 9/1999 | Haskal et al. | |
| 6,424,094 B1* | 7/2002 | Feldman | 315/169.3 |
| 6,623,608 B2 | 9/2003 | Cropper et al. | |
| 6,879,319 B2* | 4/2005 | Cok | 345/173 |
| 6,885,157 B1 | 4/2005 | Cok et al. | |
| 6,886,901 B2 | 5/2005 | Roman et al. | |
| 7,042,444 B2 | 5/2006 | Cok | |
| 7,106,307 B2 | 9/2006 | Cok | |
| 7,133,032 B2 | 11/2006 | Cok | |
| 7,202,856 B2 | 4/2007 | Cok | |
| 7,230,608 B2 | 6/2007 | Cok | |
| 2003/0030369 A1 | 2/2003 | Shih et al. | |
| 2003/0203210 A1 | 10/2003 | Graff et al. | |
| 2004/0027339 A1* | 2/2004 | Schulz | 345/173 |
| 2004/0197944 A1 | 10/2004 | Chen et al. | |

(Continued)

FOREIGN PATENT DOCUMENTS

| TW | 552687 | 9/2003 |
|---|---|---|
| TW | I225278 | 12/2004 |

(Continued)

OTHER PUBLICATIONS

"Office Action of Taiwan counterpart application" issued on Dec. 6, 2013, p. 1-p. 7, in which the listed references were cited.

*Primary Examiner* — Mary Ellen Bowman
(74) *Attorney, Agent, or Firm* — Jianq Chyun IP Office

(57) ABSTRACT

A touch-sensing display apparatus and a fabricating method thereof are provided. The touch-sensing display apparatus includes a substrate, an organic light emitting diode (OLED) display layer, and a touch structure. The OLED display layer is between the substrate and the touch structure apparatus and directly contacts with the touch structure. The touch structure includes a first water/oxygen barrier layer, an electromagnetic interference (EMI) shielding layer, a sensing circuit layer, and a second water/oxygen barrier layer. The first water/oxygen barrier layer is located on the OLED display layer. The EMI shielding layer is located on the first water/oxygen barrier layer. The sensing circuit layer is located on the EMI shielding layer. The second water/oxygen barrier layer is located on the sensing circuit layer.

38 Claims, 7 Drawing Sheets

(56) References Cited

U.S. PATENT DOCUMENTS

| | | |
|---|---|---|
| 2005/0046339 A1 | 3/2005 | Ju et al. |
| 2005/0181535 A1 | 8/2005 | Yun et al. |
| 2006/0006798 A1 | 1/2006 | Buckley |
| 2007/0049155 A1 | 3/2007 | Moro et al. |
| 2007/0241674 A1 | 10/2007 | Chao et al. |
| 2007/0281174 A1 | 12/2007 | Moro et al. |
| 2008/0012477 A1 | 1/2008 | Koo et al. |

FOREIGN PATENT DOCUMENTS

| | | |
|---|---|---|
| TW | 200500922 | 1/2005 |
| TW | I260944 | 8/2006 |
| TW | I283914 | 7/2007 |
| TW | 200739400 | 10/2007 |
| TW | I297845 | 6/2008 |
| TW | 200909855 | 3/2009 |
| TW | 200914970 | 4/2009 |

\* cited by examiner

TOUCH-SENSING DISPLAY APPARATUS AND FABRICATING METHOD THEREOF

CROSS-REFERENCE TO RELATED APPLICATION

This application claims the priority benefit of Taiwan application serial no. 98113194, filed on Apr. 21, 2009. The entirety of the above-mentioned patent application is hereby incorporated by reference herein and made a part of specification.

BACKGROUND OF THE INVENTION

1. Field of the Invention

The present application relates to a touch-sensing display apparatus and a fabricating method thereof. More particularly, the present application relates to a touch-sensing display apparatus having a capacitive touch structure and a fabricating method of the touch-sensing display apparatus.

2. Description of Related Art

Input devices of many information products have been changed from conventional keyboards and mice to touch apparatuses so as to comply with requirements for convenience, miniaturization, and being user-friendly. The touch apparatuses can be assembled to various flat panel displays to equip the same with functions of both displaying frames and inputting information of operation.

On the other hand, organic light emitting diode (OLED) refers to a semiconductor device which is capable of converting electric energy into light energy and has advantages of self-luminescence, extra slimness, high contrast, short response time (within a few microseconds), significantly wide view angle, low power consumption, wide work temperature range, panel flexibility, and so forth. Hence, the OLED is frequently applied to a number of electronic products.

In consideration of the advantages of the touch apparatus and the OLED, an OLED touch-sensing display apparatus formed by integrating the touch apparatus and the OLED can be applied in a more extensive manner. Nonetheless, device performance of the OLED is decayed by moisture and oxygen, and therefore it is necessary to further package the OLED during integration of the OLED and the touch apparatus to prevent entry of moisture and oxygen. In a conventional touch apparatus, a touch structure is formed on a substrate, while the OLED is formed on another substrate. After the two substrates are assembled, the assembled substrates are then packaged with use of adhesives. As a result, the OLED touch-sensing display apparatus inevitably has certain thickness. Therefore, issues of miniaturizing the integrated OLED touch-sensing display apparatus and furnishing the same with advantages of the touch structure and the OLED should be resolved for developing the OLED touch-sensing display apparatus.

SUMMARY OF THE INVENTION

The present application is directed to a touch-sensing display apparatus in which a touch structure is equipped with a touch function and also serves to an OLED display passivation layer.

The present application is further directed to a fabricating method of a touch-sensing display apparatus. In the fabricating method, formation a touch structure is integrated into a passivation process of an OLED display layer so as to form the touch-sensing display apparatus with an extra-thin thickness.

In the present application, a touch-sensing display apparatus including a substrate, an OLED display layer, and a touch structure is provided. The OLED display layer is disposed on a substrate. The touch structure is disposed on the OLED display layer. Here, the OLED display layer is connected between the substrate and the touch structure, and the touch structure directly contacts with the OLED display layer. The touch structure includes a sensing circuit layer and a second water/oxygen barrier layer. The sensing circuit layer is disposed on the OLED display layer, and the second water/oxygen barrier layer is disposed on the sensing circuit layer.

In the present application, a fabricating method of a touch-sensing display apparatus including following steps is further provided. First, an OLED display layer is formed on a substrate. Next, a touch structure is formed on the OLED display layer. Here, a method of forming the touch structure includes following steps. First, a first water/oxygen barrier layer is formed on the OLED display layer. A sensing circuit layer is then formed on the first water/oxygen barrier layer. Next, a second water/oxygen barrier layer is formed on the sensing circuit layer.

Based on the above, the water/oxygen barrier layers in the touch structure of the touch-sensing display apparatus are utilized for blocking moisture and oxygen according to the present application, such that display quality of the OLED display layer is not affected by the moisture and the oxygen.

In order to make the aforementioned and other features and advantages of the present invention more comprehensible, several embodiments accompanying figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

Figure 1A:
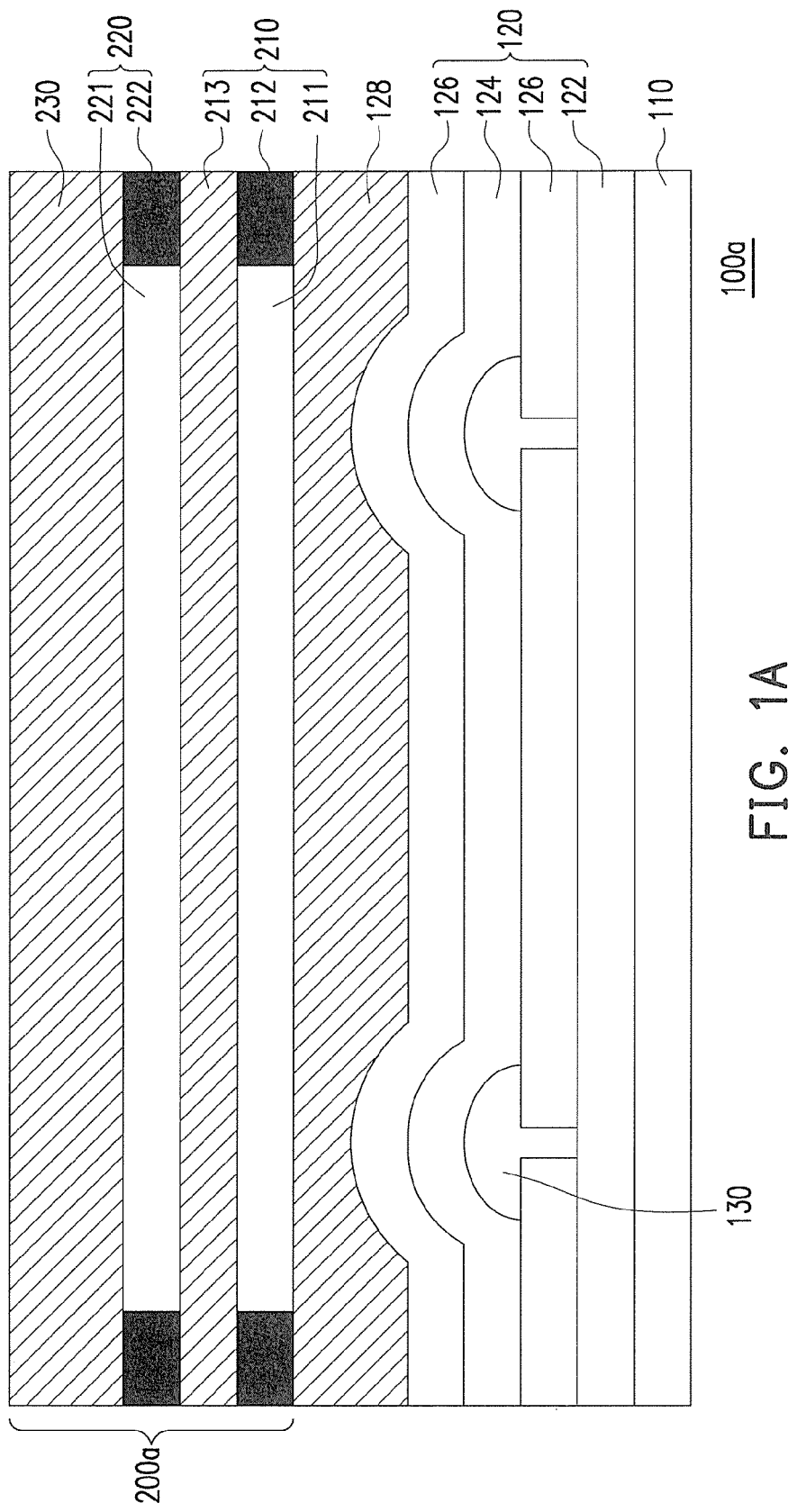
FIG. 1A is a schematic view of a touch-sensing display apparatus according to one embodiment of the present invention.

FIG. 1A is a schematic view of a touch-sensing display apparatus according to one embodiment of the present invention. Referring to FIG. 1A, the touch-sensing display apparatus 100a of the present embodiment includes a substrate 110, an OLED display layer 120, and a touch structure 200a. The substrate 110 can be a rigid substrate or a flexible substrate, wherein the rigid substrate can be a glass substrate, a silicon wafer substrate, or a metal substrate. A material of the flexible substrate is, for example, polyethylene terephthalate (PET), polyethylene naphthalate (PEN), polyester (PES), polymethylmethacrylate (PMMA), polycarbonate (PC), polyimide (PI), or metal foil.

As indicated in FIG. 1A, the OLED display layer 120 is disposed on the substrate 110. The OLED display layer 120 of the present embodiment includes an active array device 122, an organic light emitting layer 124, and a pair of electrode layers 126. The active array device 122 is disposed on the substrate 110. The electrode layers 126 are disposed on the substrate 110 and cover the active array device 122. The organic light emitting layer 124 is disposed between the pair of electrode layers 126. Here, the active array device 122 includes a plurality of active devices (not shown), and the electrode layer 126 disposed below the organic light emitting layer 124 is electrically connected to the active devices on the active array device 122. Preferably, a first water/oxygen barrier layer 128 can be disposed on the OLED display layer 120 to prevent oxygen and moisture from entering into the OLED display layer 120. Besides, in the present embodiment, the OLED display layer 120 further includes a pixel defining layer 130.

The pair of electrode layers 126 can be transparent electrodes, semi-transparent electrodes, or non-transparent metal electrodes. Providing that the OLED display layer 120 emits light upward, it should be mentioned that the electrode layer 126 located on the organic light emitting layer 124 should be the transparent electrode or the semi-transparent electrode, such that the light can pass through the electrode layer 126. A material of the transparent electrode is, for example, indium tin oxide (ITO), indium zinc oxide (IZO), aluminum doped zinc oxide (AZO), or other transparent conductive materials.

The touch structure 200a is disposed on the OLED display layer 120. The OLED display layer 120 is connected between the substrate 110 and the touch structure 200a, and the touch structure 200a directly contacts with the first water/oxygen barrier layer 128. Here, the touch structure 200a includes a sensing circuit layer 220 and a second water/oxygen barrier layer 230. Preferably, the touch structure 200a can further include an electromagnetic interference (EMI) shielding layer 210.

The first water/oxygen barrier layer 128 is located on the OLED display layer 120. The EMI shielding layer 210 is disposed on the first water/oxygen barrier layer 128, and the sensing circuit layer 220 can be disposed on the EMI shielding layer 210. The second water/oxygen barrier layer 230 is disposed on the sensing circuit layer 220.

The EMI shielding layer 210 includes a first water/oxygen barrier conductive layer 211, a first circuit pattern layer 212, and a first water/oxygen barrier insulation layer 213, for instance. As depicted in FIG. 1A, in the EMI shielding layer 210 of the present embodiment, the first circuit pattern layer 212 is connected to the first water/oxygen barrier conductive layer 211, and the first circuit pattern layer 212 and the first water/oxygen barrier conductive layer 211 are located on the first water/oxygen barrier layer 128. However, said arrangement is not limited in the present embodiment.

The first water/oxygen barrier layer 128 and the EMI shielding layer 210 can be individually disposed or be disposed in a reverse manner in comparison with said arrangement.

The first water/oxygen barrier layer 128 can be an inorganic thin film, an organic thin film, or a combination thereof.

A material of the first water/oxygen barrier conductive layer 211 is, for example, an inorganic transparent conductive material or an organic transparent conductive polymer material. A material of the first water/oxygen barrier insulation layer 213 includes an organic material, an inorganic material, a transparent organic-inorganic hybrid nano-particle, an organic photoresist material, or a transparent polymer thin film material. Here, the first water/oxygen barrier layer 128 and the first water/oxygen barrier insulation layer 213 can be made of the inorganic material, such as $Al_2O_3$, $SiO_x$, $SiN_x$, or $SiO_xN_y$. Alternatively, the first water/oxygen barrier layer 128 and the first water/oxygen barrier insulation layer 213 can be made of the organic material including parylene or acrylic or made of the organic-inorganic hybrid nano-particle, such as a mixture of diamond-like carbon (DLC) and silicon (Si).

The sensing circuit layer 220 of the present embodiment includes a second water/oxygen barrier conductive layer 221 and a second circuit pattern layer 222. The second circuit pattern layer 222 is connected to the second water/oxygen barrier conductive layer 221, and the second circuit pattern layer 222 and the second water/oxygen barrier conductive layer 221 are located on the EMI shielding layer 210. Besides, the second water/oxygen barrier conductive layer 221 not only can be conducted to sense the touch position but also can block oxygen and moisture.

Figure 1B:
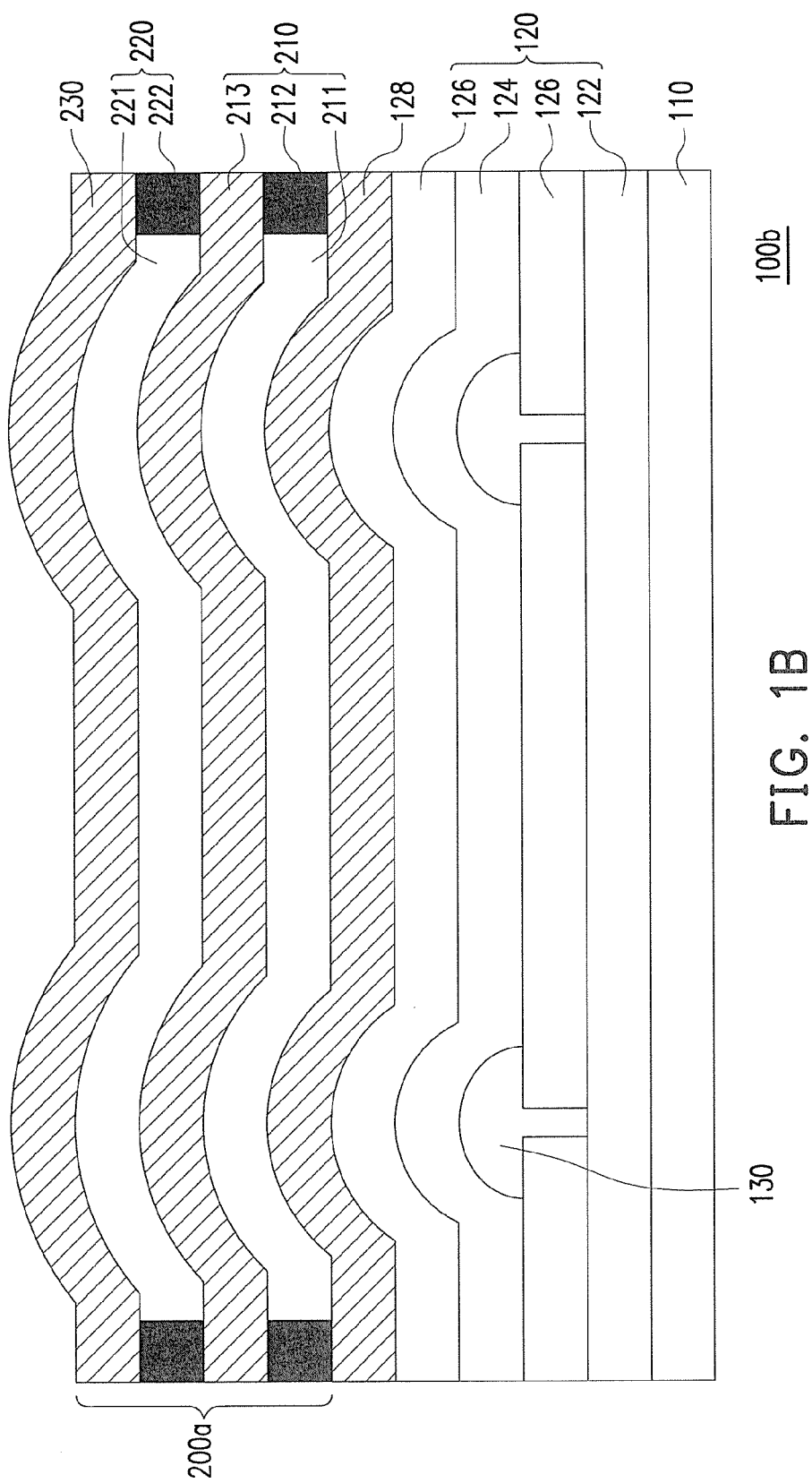
FIG. 1B is a schematic view of a touch-sensing display apparatus according to one embodiment of the present invention.

Based on the above, it is known that the EMI shielding layer 210 of the present embodiment includes the first water/oxygen barrier conductive layer 211, the first circuit pattern layer 212, and the first water/oxygen barrier insulation layer 213, and the sensing circuit layer 220 includes the second water/oxygen barrier conductive layer 222 and the second circuit pattern layer 221. In the present embodiment, a number of stacked layers are exemplified. The stacked layers are equipped with the functions of sensing circuits and shielding EMI. Moreover, the stacked layers are able to prevent the OLED display layer 120 from being affected by moisture and oxygen and preclude device reliability and lifetime of the OLED display layer 120 from being worsened. As such, the OLED display 120 can be well protected On the other hand, in the embodiment as illustrated in FIG. 1B, the EMI shielding layer 210 and the touch structure 200a in the touch-sensing display apparatus 100a conformally cover the first water/oxygen barrier layer 128, for example.

A material of the first circuit pattern layer 212 and the second circuit pattern layer 222 includes an inorganic transparent conductive material, an organic transparent conductive material, or a metal conductive material. The first water/oxygen barrier insulation layer 213 can be an inorganic thin film, an organic thin film, or a combination thereof. A material of the first water/oxygen barrier conductive layer 211 and the second water/oxygen barrier conductive layer 221 is, for example, an inorganic transparent conductive material or an organic transparent conductive polymer material, wherein the inorganic transparent conductive material provides better performance on blocking oxygen and moisture.

The second water/oxygen barrier layer 230 of the present embodiment can be a composite layer composed of an anti-reflection layer, an anti-glare layer, an anti-smudge layer, a hard coating layer, or a combination thereof. In other words, the anti-reflection layer, the anti-glare layer, the anti-smudge layer, and the hard coating layer can be individually disposed or correspondingly disposed. The second water/oxygen barrier layer 230 not only can serve to passivation but also can accomplish other optical or protective effects based on different film layers in the second water/oxygen barrier layer 230. For instance, the anti-glare layer can veil glare of the touch-sensing display apparatus 100a to some extent and ensure users favorable image quality. The anti-smudge layer is able to better preclude the touch-sensing display apparatus 100a from being smudged, and the hard coating layer can better prevent the touch-sensing display apparatus 100a from being damaged by scratching. A material of the anti-reflection layer can be silicon dioxide or titanium dioxide. A material of the anti-glare layer can be silicon dioxide, titanium dioxide, indium oxide, or zinc oxide. A material of the anti-smudge layer is, for example, fluorine-containing silicon material. A material of the hard coating layer is, for example, acrylic, silicon dioxide, tantalum oxide, zirconium oxide, or DLC.

Note that the film layers included in the first water/oxygen barrier layer 128, the first water/oxygen barrier insulation layer 213, and the second water/oxygen barrier layer 230 are merely exemplary and are not limited in the present invention. People having ordinary skill in the art should be able to made necessary modifications based on actual demands.

In the aforesaid touch-sensing display apparatus 100a, the touch structure 200a is composed of the first water/oxygen barrier layer 128, the first water/oxygen barrier conductive layer 211, the first water/oxygen barrier insulation layer 213, the second water/oxygen barrier conductive layer 221, and the second water/oxygen barrier layer 230 so as to block oxygen and moisture, thus reducing the possibility of damage of the touch-sensing display apparatus 100a. As a result, this structure can serve to well package the OLED display layer 120.

The touch structure 200a in the above embodiment is a surface capacitive touch structure. However, a projected capacitive touch structure can also be employed in other embodiments. A fabricating method of the aforesaid touch-sensing display apparatus 100a and other types of touch-sensing display apparatuses are described in the following embodiments.

Figure 2:
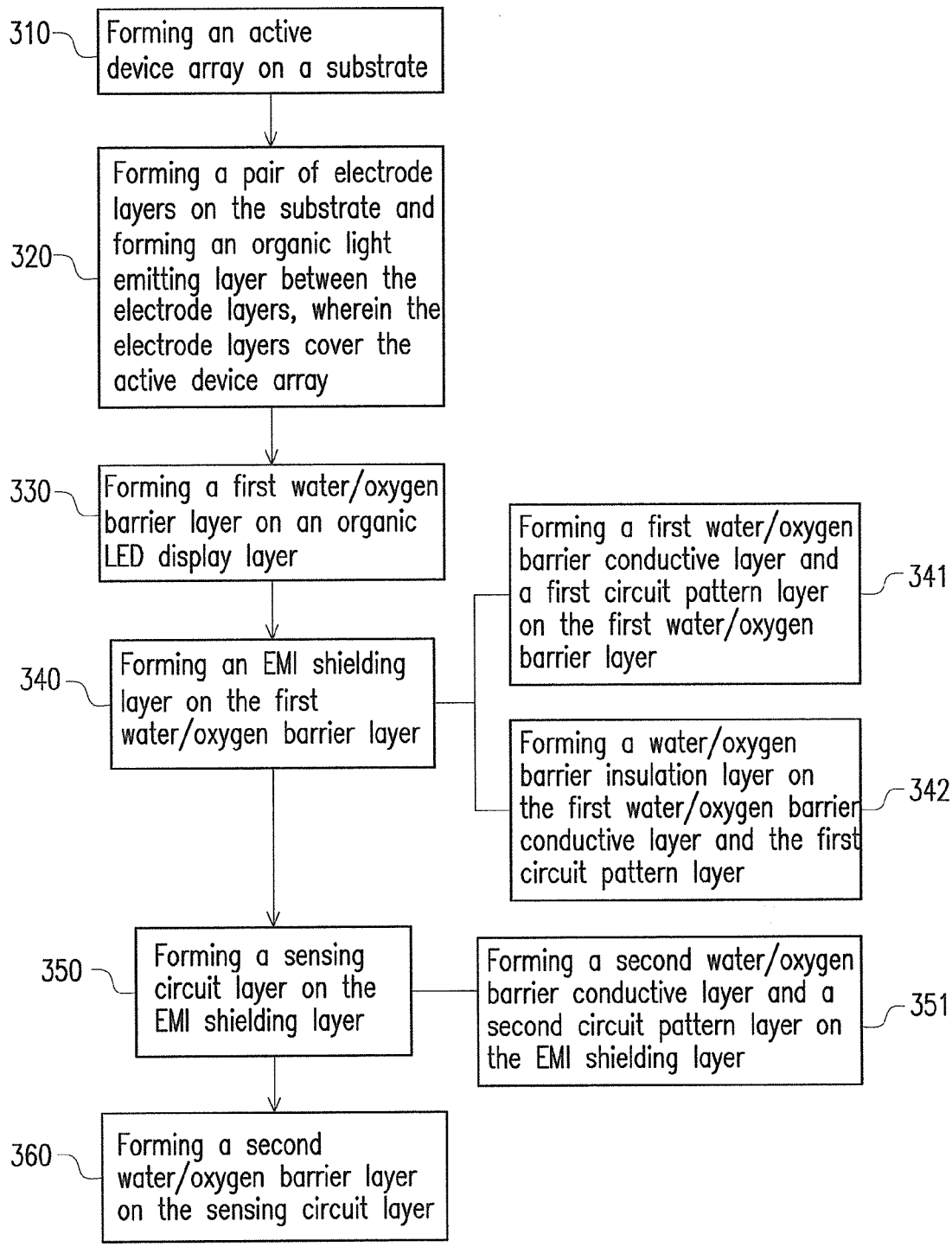
FIG. 2 is a flowchart illustrating a fabricating method of a touch-sensing display apparatus according to one embodiment of the present invention.

FIG. 2 is a flowchart illustrating a fabricating method of a touch-sensing display apparatus according to one embodiment of the present invention. Referring to FIGS. 1A and 2, a fabricating method of the touch-sensing display apparatus 100a includes forming an OLED display layer 120 on a substrate 110 and forming a touch structure 200a on the OLED display layer 120. Detailed steps are explained below.

First of all, in step 310, an active array device 122 is formed on the substrate 110.

Next, in step 320, a pair of electrode layers 126 is formed on the substrate 110. The electrode layers 126 cover the active array device 122, and an organic light emitting layer 124 is formed between the electrode layers 126. Here, the electrode layer 126 located below the organic light emitting layer 124 can be electrically connected to active devices (not shown) on the active array device 122, for example. Besides, in the present embodiment, a pixel defining layer 130 is further fowled on the active array device 122.

Thereafter, in step 330, a first water/oxygen barrier layer 128 is formed on the OLED display layer 120. According to the present embodiment, the first water/oxygen barrier layer 128 can be made of an organic thin film, an inorganic single-layer thin film, or a combination thereof. Since the material of the first water/oxygen barrier layer 128 differs, the method of forming the first water/oxygen barrier layer 128 varies. Particularly, when the first water/oxygen barrier layer 128 is made of an inorganic material, such as $Al_2O_3$, SiOx, SiNx, or SiOxNy, a chemical vapor deposition (CVD) process or a sputtering process can be performed to form the first water/oxygen barrier layer 128. When the first water/oxygen barrier layer 128 is made of an organic material, such as parylene or acrylic, a CVD process can be performed to form the first water/oxygen barrier layer 128. When the first water/oxygen barrier layer 128 is made of an organic-inorganic mixed material, such as a mixture of a DLC film and Si, a CVD process can be performed to form the first water/oxygen barrier layer 128.

After that, in step 340, an EMI shielding layer 210 is formed on the first water/oxygen barrier layer 128. The method of forming the EMI shielding layer 210 includes a step 341 of forming a first water/oxygen barrier conductive layer 211 and a first circuit pattern layer 212 on the first water/oxygen barrier layer 128 and a step 342 of forming the first water/oxygen barrier insulation layer 213 on the first water/oxygen barrier conductive layer 211 and the first circuit pattern layer 212.

In step 340, the layers using different materials are formed by different methods, and detailed descriptions are provided below. When the first water/oxygen barrier conductive layer 211 is made of an inorganic transparent conductive material, a sputtering process can be implemented to form the first water/oxygen barrier conductive layer 211. When the first water/oxygen barrier conductive layer 211 is made of an organic transparent conductive polymer material, an ink jet printing process or a spin coating process can be implemented to form the first water/oxygen barrier conductive layer 211, for example. When the first circuit pattern layer 212 is made of silver (Ag), a screen printing process or an ink jet printing process can be carried out to form the first circuit pattern layer 212, for example. When the first circuit pattern layer 212 is made of stacked molybdenum/aluminum/molybdenum or stacked titanium/aluminum/titanium, a sputtering process or a photolithography and etching process can be carried out to form the first circuit pattern layer 212, for example. When the first water/oxygen barrier insulation layer 213 is, for example, made of an inorganic material, such as $Al_2O_3$, $SiO_x$, $SiN_x$, or $SiO_xN_y$, a sputtering process or a plasma enhanced chemical vapor deposition (PECVD) process can be carried out to form the first water/oxygen barrier insulation layer 213. When the first water/oxygen barrier layer 213 is made of an organic material, such as parylene or acrylic, a CVD process can be performed to form the first water/oxygen barrier layer 213.

Next, in step 350, a sensing circuit layer 220 is formed on the EMI shielding layer 210. Particularly, the method 350 includes a step 351 of forming a second water/oxygen barrier conductive layer 221 and a second circuit pattern layer 222 on the EMI shielding layer 210.

Thereafter, in step 360, a second water/oxygen barrier layer 230 is formed on the sensing circuit layer 220. The second water/oxygen barrier layer 230 can include an anti-reflection layer, an anti-glare layer, an anti-smudge layer, a hard coating layer, or a combination thereof. When the anti-reflection layer is made of silicon dioxide or titanium dioxide, an electron beam evaporation process can be performed to form the anti-reflection layer. When the anti-reflection layer, the anti-glare layer, or the hard coating layer is made of an organic-inorganic hybrid nano-particle, or when the anti-smudge layer is made of a fluorine-containing silicon material, these layers can be formed by performing a sputtering process, a spin coating process, a dipping process, a spray process, a flow coating process, or an ink jet printing process. Besides, when the hard coating layer is made of DLC, a CVD process can be performed to form the hard coating layer.

Figure 3A:
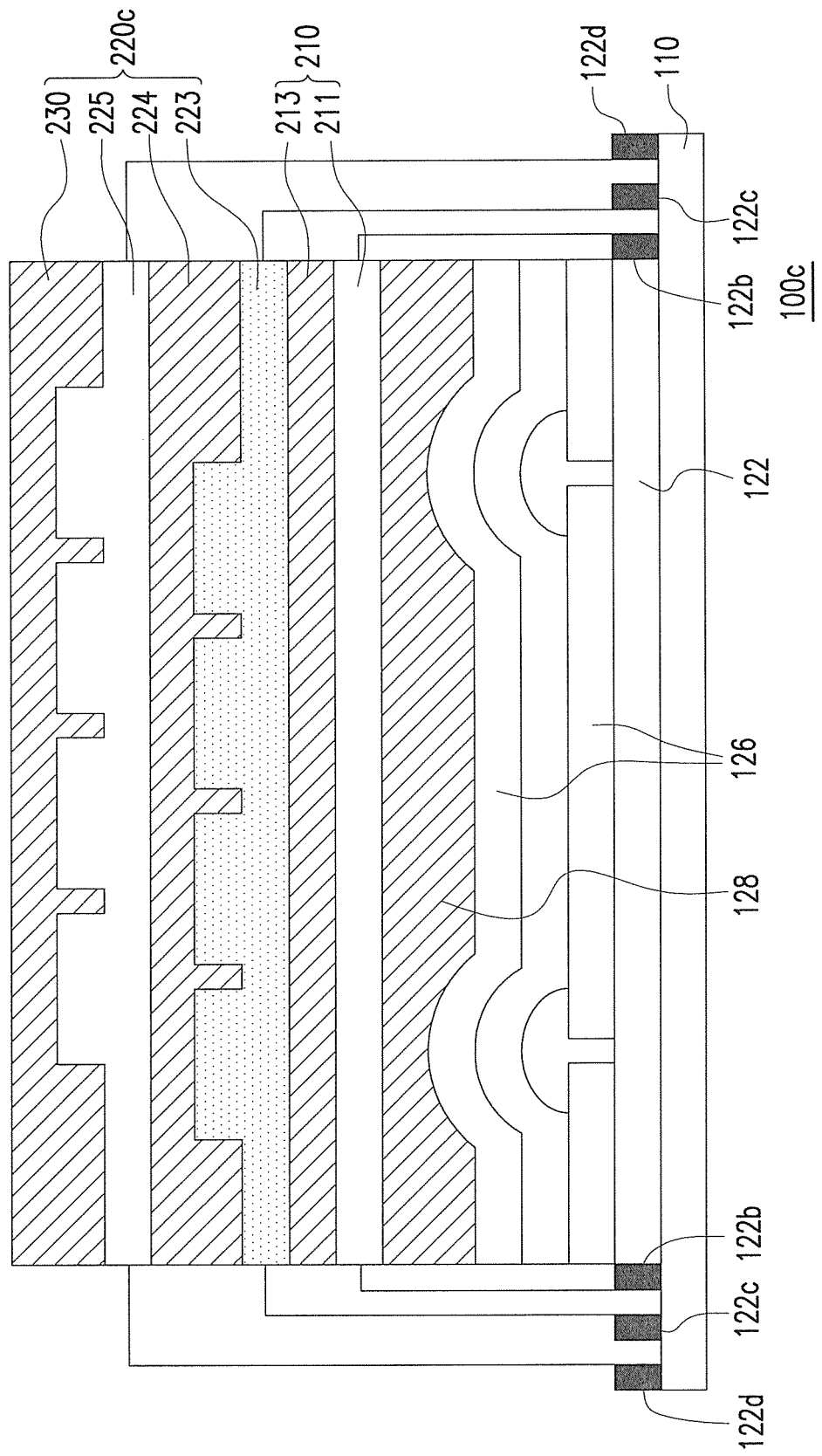
FIG. 3A is a schematic view illustrating a touch-sensing display apparatus according to another embodiment of the present invention.
Figure 3B:
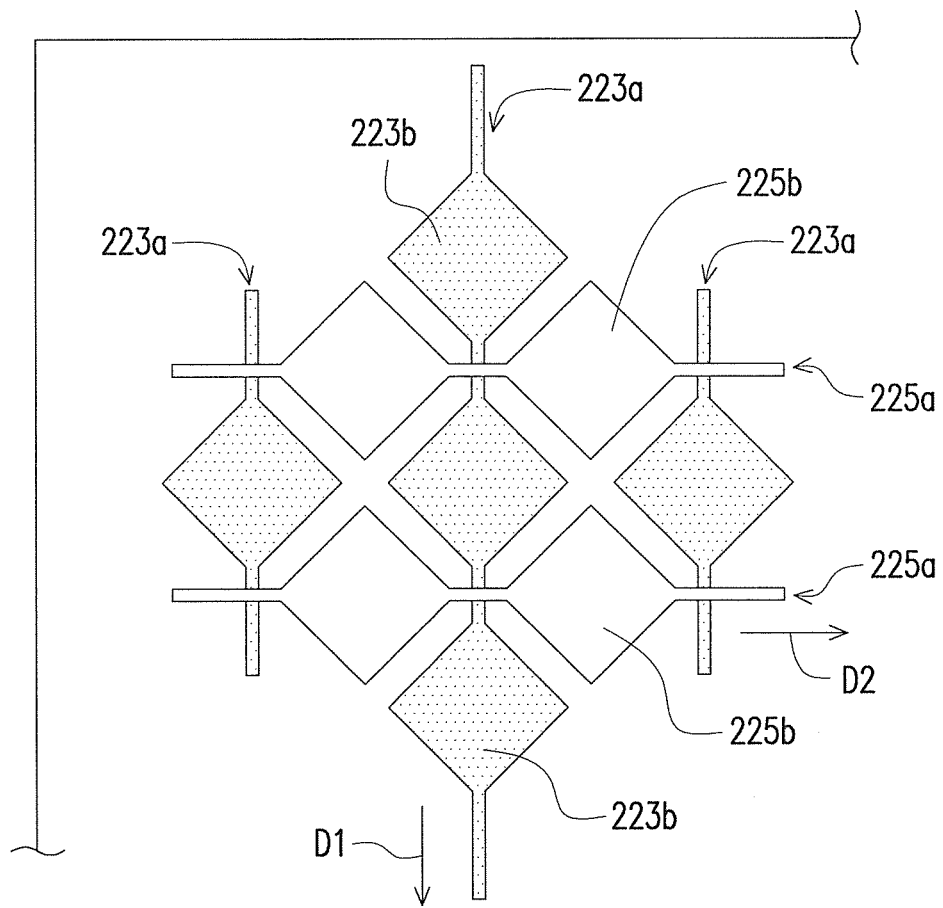
FIG. 3B is a partial top view of first touch electrode series and second touch electrode series depicted in FIG. 3A.

FIG. 3A is a schematic view illustrating a touch-sensing display apparatus according to another embodiment of the present invention. FIG. 3B is a partial top view of first touch electrode series and second touch electrode series depicted in FIG. 3A. To facilitate descriptions, some elements depicted in FIG. 3A are omitted in FIG. 3B.

Referring to FIGS. 3A and 3B, the touch-sensing display apparatus 100c of the present embodiment is structurally similar to the touch-sensing display apparatus 100a of the previous embodiment, and therefore the same elements in the two touch-sensing display apparatuses 100c and 100a are marked with the same reference numbers. The main difference between the two touch-sensing display apparatuses 100c and 100a lies in the touch structures 200c and 200a. In the present embodiment, the touch structure 200c is a projected capacitive touch structure, which is different from the surface capacitive touch structure employed in the previous embodiment.

In the EMI shielding layer 210 of the present embodiment, the first water/oxygen barrier conductive layer 211 is electrically connected to a first conductive wire 122b which is formed on the substrate 110 beforehand.

The sensing circuit layer 220c of the present embodiment further includes a first patterned conductive layer 223, a second patterned conductive layer 225, and a second water/oxygen barrier insulation layer 224. The first patterned conductive layer 223 is disposed on the first water/oxygen barrier insulation layer 213 and is connected to a second conductive wire 122c which is formed on the substrate 110 beforehand. The first patterned conductive layer 223 has a plurality of first touch electrode series 223a extending along a first direction D1. Each of the first touch electrode series 223a includes a plurality of first touch pads 223b electrically connected to one another. The second patterned conductive layer 225 is disposed on the second water/oxygen barrier insulation layer 224 and is connected to a third conductive wire 122d which is formed on the substrate 110 beforehand. The second patterned conductive layer 225 has a plurality of second touch electrode series 225a extending along a second direction D2, and the second direction D2 is different from the first direction D1. Each of the second touch electrode series 225a includes a plurality of second touch pads 225b electrically connected to one another.

The fabricating method of the touch-sensing display apparatus 100c is substantially the same as the fabricating method of the touch-sensing display apparatus 100a of the previous embodiment, while the difference therebetween lies in the method of forming the first patterned conductive layer 223 and the second patterned conductive layer 225. The method of forming the first patterned conductive layer 223 includes forming the first touch electrode series 223a, and the method of forming the second patterned conductive layer 225 includes foaming the second touch electrode series 225a. Additionally, it should be mentioned that the first conductive wire 122b, the second conductive wire 122c, and the third conductive wire 122d can all be circuit pattern layers which are formed on the active array device 122 in advance. That is to say, during formation of the active array device 122 on the substrate 110, the first conductive wire 122b, the second conductive wire 122c, and the third conductive wire 122d can be formed as well.

Figure 4A:
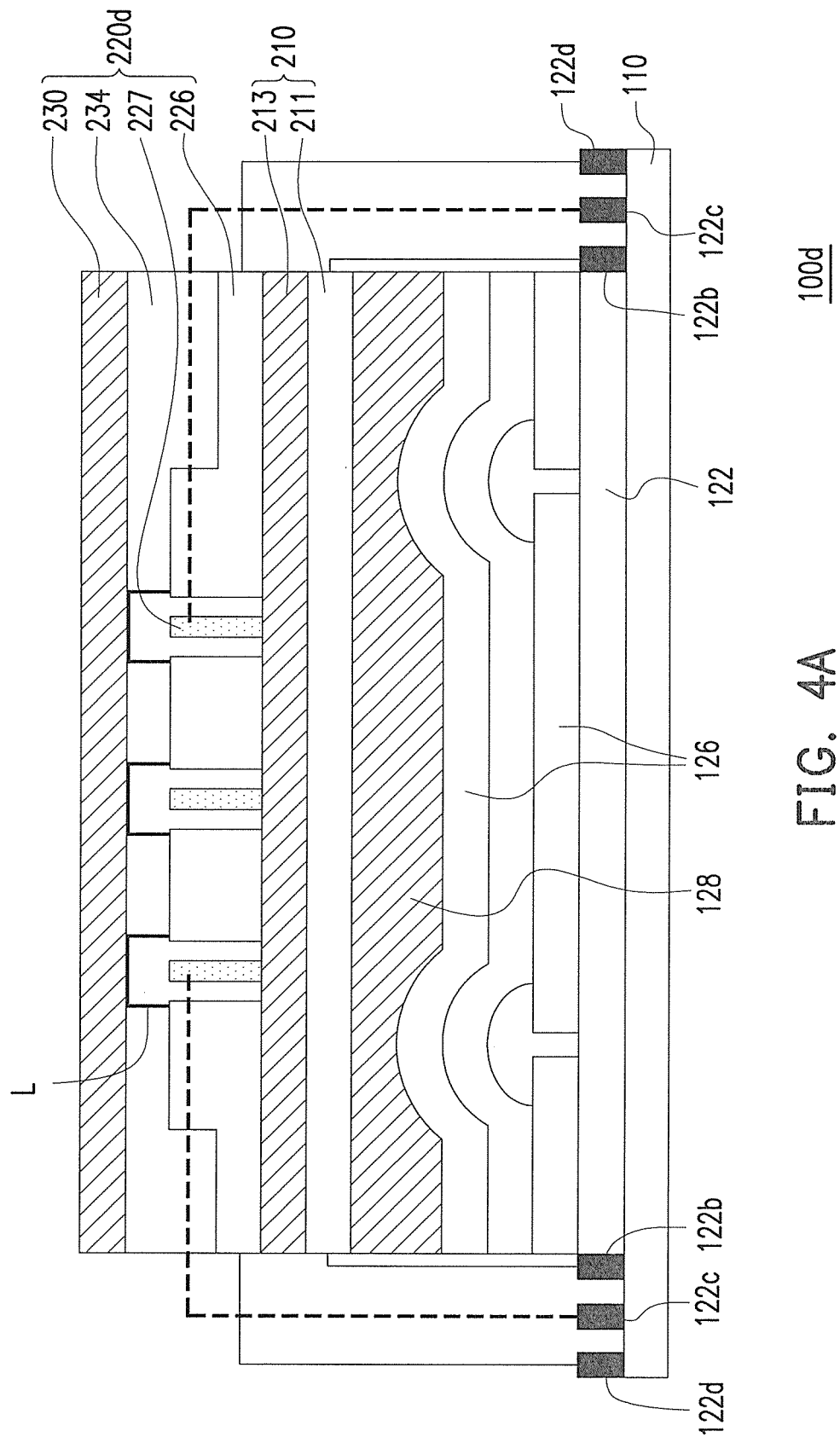
FIG. 4A is a schematic view of a touch-sensing display apparatus according to still another embodiment of the present invention.
Figure 4B:
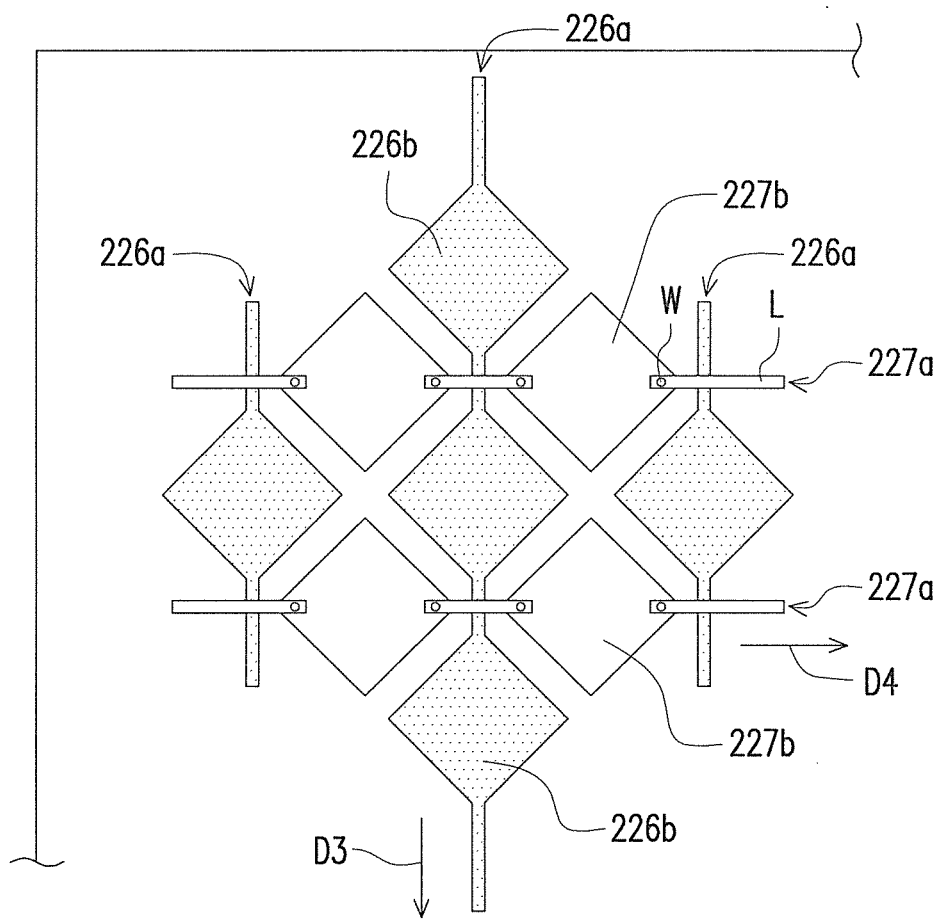
FIG. 4B is a partial top view of third touch electrode series and fourth touch electrode series depicted in FIG. 4A.

FIG. 4A is a schematic view of a touch-sensing display apparatus according to still another embodiment of the present invention. FIG. 4B is a partial top view of third touch electrode series and fourth touch electrode series depicted in FIG. 4A. Referring to FIGS. 4A and 4B, the touch-sensing display apparatus 100d of the present embodiment is substantially similar to the touch-sensing display apparatus 100c of the previous embodiment, while the difference therebetween lies in the structure of the sensing circuit layers 220c and 220d.

Specifically, the sensing circuit layer 220d of the present embodiment includes a third patterned conductive layer 226, a fourth patterned conductive layer 227, a second water/oxygen barrier insulation layer 234, and a bridge conductive wire L. The third patterned conductive layer 226 is disposed on the EMI shielding layer 210. In detail, the third patterned conductive layer 226 has a plurality of third touch electrode series 226a extending along a third direction D3. Each of the third touch electrode series 226a includes a plurality of third touch pads 226b electrically connected to one another. Besides, the third patterned conductive layer 226 is electrically connected to the second conductive wire 122c on the substrate 110, as shown by dotted lines in FIG. 4A.

The fourth patterned conductive layer 227 is also disposed on the EMI shielding layer 210. The fourth patterned conductive layer 227 has a plurality of fourth touch electrode series 227a extending along a fourth direction D4, and the fourth direction D4 is different from the third direction D3. Moreover, the fourth patterned conductive layer 227 is electrically connected to the third conductive wire 122d on the substrate 110. Each of the fourth touch electrode series 227a includes a plurality of fourth touch pads 227b electrically connected to one another. The second water/oxygen barrier insulation layer 234 covers the third patterned conductive layer 226 and the fourth patterned conductive layer 227. Specifically, the fourth touch pads 227b are electrically connected to one another through the bridge conductive wire L disposed on the second water/oxygen barrier insulation layer 234.

As for the disposition of the bridge conductive wire L, for instance, a plurality of holes W can be first formed on the second water/oxygen barrier insulation layer 234 on the fourth patterned conductive layer 227 after the formation of the second water/oxygen barrier insulation layer 234. In some embodiment, the second water/oxygen barrier insulation layer 234 and the holes W thereon can be simultaneously formed. The holes W are then filled with a conductive material so as to form the bridge conductive wire L. The bridge conductive wire L is formed by performing a screen printing process, an ink jet printing process, a photolithography and etching process, or a sputtering process, for example.

In light of the foregoing, the touch-sensing display apparatus of the present application is equipped with the water/oxygen barrier layers, the water/oxygen barrier conductive layers, and the water/oxygen barrier insulation layers to block moisture and oxygen and prevent reduction of display quality of the touch-sensing display apparatus caused by the moisture and oxygen. As such, the touch structure of the present application serves as an OLED display passivation layer. Moreover, in the fabricating method of the touch-sensing display apparatus, formation of the touch structure can be integrated into fabrication of the OLED thin film passivation. As a result, production costs can be reduced, and the manufacturing process can be simplified.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A touch-sensing display apparatus, comprising:
 a substrate;
 an organic light emitting diode display layer disposed on the substrate, the organic light emitting diode display layer comprising:
  an active array device disposed on the substrate;
  a pair of electrode layers disposed on the substrate and covering the active array device;

an organic light emitting layer disposed between the pair of electrode layers; and
a first water/oxygen barrier layer disposed on the organic light emitting diode display layer; and
a touch structure disposed on the organic light emitting diode display layer, wherein the organic light emitting diode display layer is connected between the substrate and the touch-sensing display apparatus, and the touch structure directly contacts with the organic light emitting diode display layer, the touch structure comprising:
an electromagnetic interference shielding layer, and the electromagnetic interference shielding layer comprising:
a first water/oxygen barrier conductive layer disposed on the first water/oxygen barrier layer;
a first circuit pattern layer connected to the first water/oxygen barrier conductive layer; and
a first water/oxygen barrier insulation layer disposed on the first water/oxygen barrier conductive layer;
a sensing circuit layer disposed on the organic light emitting diode display layer; and
a second water/oxygen barrier layer disposed on the sensing circuit layer.

2. The touch-sensing display apparatus as claimed in claim 1, wherein the sensing circuit layer further comprises a second water/oxygen barrier conductive layer disposed on the electromagnetic interference shielding layer.

3. The touch-sensing display apparatus as claimed in claim 2, wherein the sensing circuit layer further comprises a second circuit pattern layer disposed on the first water/oxygen barrier insulation layer, and the second circuit pattern layer is connected to the second water/oxygen barrier conductive layer.

4. A touch-sensing display apparatus, comprising:
a substrate;
an organic light emitting diode display layer disposed on the substrate, the organic light emitting diode display layer comprising:
an active array device disposed on the substrate;
a pair of electrode layers disposed on the substrate and covering the active array device;
an organic light emitting layer disposed between the pair of electrode layers; and
a first water/oxygen barrier layer disposed on the organic light emitting diode display layer; and
a touch structure disposed on the organic light emitting diode display layer, wherein the organic light emitting diode display layer is connected between the substrate and the touch-sensing display apparatus, and the touch structure directly contacts with the organic light emitting diode display layer, the touch structure comprising:
an electromagnetic interference shielding layer, and the electromagnetic interference shielding layer comprising:
a first water/oxygen barrier conductive layer disposed on the first water/oxygen barrier layer, wherein the first water/oxygen barrier conductive layer is electrically connected to a first conductive wire, and the first conductive wire is disposed on the substrate; and
a first water/oxygen barrier insulation layer disposed on the first water/oxygen barrier conductive layer;
a sensing circuit layer disposed on the organic light emitting diode display layer; and
a second water/oxygen barrier layer disposed on the sensing circuit layer.

5. The touch-sensing display apparatus as claimed in claim 4, wherein the first water/oxygen barrier layer is an inorganic single-layer film, an organic single-layer film, or a combination thereof.

6. The touch-sensing display apparatus as claimed in claim 4, wherein a material of the first water/oxygen barrier layer comprises an organic material, an inorganic material, a transparent organic-inorganic hybrid nano-particle, an organic photoresist material, or a transparent polymer thin film material.

7. The touch-sensing display apparatus as claimed in claim 6, wherein the inorganic material comprises $Al_2O_3$, $SiO_x$, $SiN_x$, or $SiO_xN_y$, the organic material comprises parylene, acrylic, or diamond-like carbon, and the organic-inorganic hybrid nano-particle comprises a mixture of diamond-like carbon and silicon.

8. The touch-sensing display apparatus as claimed in claim 4, wherein the second water/oxygen barrier layer comprises an anti-reflection layer, an anti-glare layer, an anti-smudge layer, a hard coating layer, or a combination thereof.

9. The touch-sensing display apparatus as claimed in claim 4, wherein a material of the second water/oxygen barrier layer comprises silicon dioxide, titanium dioxide, indium oxide, arsenide oxide, zinc oxide, tantalum oxide, zirconium oxide, or diamond-like carbon.

10. The touch-sensing display apparatus as claimed in claim 4, wherein a material of the substrate comprises glass, silicon, polyethylene terephthalate, polyethylene naphthalate, polyester, polyrnethylmethacrylate, polycarbonate, polyimide, or a metal alloy.

11. The touch-sensing display apparatus as claimed in claim 4, wherein the sensing circuit layer comprises:
a first patterned conductive layer disposed on the electromagnetic interference shielding layer, wherein the first patterned conductive layer is connected to a second conductive wire, and the second conductive wire is disposed on the substrate;
a second water/oxygen barrier insulation layer disposed on the first patterned conductive layer; and
a second patterned conductive layer disposed on the second water/oxygen barrier insulation layer, wherein the second patterned conductive layer is connected to a third conductive wire, and the third conductive wire is disposed on the substrate.

12. The touch-sensing display apparatus as claimed in claim 11, the first patterned conductive layer comprising a plurality of first touch electrode series extending along a first direction, each of the first touch electrode series comprising a plurality of first touch pads electrically connected to one another, the second patterned conductive layer comprising a plurality of second touch electrode series extending along a second direction, each of the second touch electrode series comprising a plurality of second touch pads electrically connected to one another, wherein the first direction is different from the second direction.

13. The touch-sensing display apparatus as claimed in claim 1, wherein the first water/oxygen barrier layer is an inorganic single-layer film, an organic single-layer film, or a combination thereof.

14. The touch-sensing display apparatus as claimed in claim 3, wherein a material of the first circuit pattern layer and the second circuit pattern layer comprises an inorganic transparent conductive material, an organic transparent conductive material, or a metal conductive material.

15. The touch-sensing display apparatus as claimed in claim 4, wherein the sensing circuit layer comprises:

a third patterned conductive layer disposed on the electromagnetic interference shielding layer, wherein the third patterned conductive layer comprises a plurality of third touch electrode series extending along a third direction, the third patterned conductive layer is connected to a second conductive wire, and the second conductive wire is disposed on the substrate; and a fourth patterned conductive layer disposed on the electromagnetic interference shielding layer, wherein the fourth patterned conductive layer comprises a plurality of fourth touch electrode series extending along a fourth direction, the fourth patterned conductive layer is connected to a third conductive wire, the third conductive wire is disposed on the substrate, and the third direction is different from the fourth direction.

16. The touch-sensing display apparatus as claimed in claim 15, wherein each of the third touch electrode series comprises a plurality of third touch pads electrically connected to one another, each of the fourth touch electrode series comprises a plurality of fourth touch pads electrically connected to one another, and the fourth touch pads are electrically connected to one another through a bridge conductive wire.

17. The touch-sensing display apparatus as claimed in claim 1, wherein the first water/oxygen barrier insulation layer in the electromagnetic interference shielding layer comprises an inorganic single-layer film, an organic single-layer film, or a combination thereof.

18. The touch-sensing display apparatus as claimed in claim 4, wherein a material of the first water/oxygen barrier conductive layer comprises an inorganic transparent conductive material or an organic transparent conductive polymer material.

19. The touch-sensing display apparatus as claimed in claim 1, wherein a material of the first water/oxygen barrier layer comprises an organic material, an inorganic material, a transparent organic-inorganic hybrid nano-particle, an organic photoresist material, or a transparent polymer thin film material.

20. The touch-sensing display apparatus as claimed in claim 19, wherein the inorganic material comprises $Al_2O_3$, $SiO_x$, $SiN_x$, or $SiO_xN_y$, the organic material comprises parylene, acrylic, or diamond-like carbon, and the organic-inorganic hybrid nano-particle comprises a mixture of diamond-like carbon and silicon.

21. The touch-sensing display apparatus as claimed in claim 1, wherein the second water/oxygen barrier layer comprises an anti-reflection layer, an anti-glare layer, an anti-smudge layer, a hard coating layer, or a combination thereof.

22. The touch-sensing display apparatus as claimed in claim 1, wherein a material of the second water/oxygen barrier layer comprises silicon dioxide, titanium dioxide, indium oxide, arsenide oxide, zinc oxide, tantalum oxide, zirconium oxide, or diamond-like carbon.

23. The touch-sensing display apparatus as claimed in claim 1, wherein a material of the substrate comprises glass, silicon, polyethylene terephthalate, polyethylene naphthalate, polyester, polymethylmethacrylate, polycarbonate, polyimide, or a metal alloy.

24. A fabricating method of a touch-sensing display apparatus, comprising:

forming an organic light emitting diode display layer on a substrate, wherein a method of forming the organic light emitting diode display layer comprises:
forming an active array device on the substrate;
forming a pair of electrode layers on the substrate, wherein the active array device is covered by the pair of electrode layers;
forming an organic light emitting layer between the pair of electrode layers; and
forming the first water/oxygen barrier layer on the pair of electrode layers;

forming a first water/oxygen barrier layer on the organic light emitting diode display layer; and forming a touch structure on the organic light emitting diode display layer, wherein a method of forming the touch structure comprises:
forming an electromagnetic interference shielding layer on the first water/oxygen barrier layer, wherein a method of forming the electromagnetic interference shielding layer comprises:
forming a first water/oxygen barrier conductive layer on the first water/oxygen barrier layer;
forming a first circuit pattern layer connected to the first water/oxygen barrier conductive layer; and
forming a first water/oxygen barrier insulation layer on the first water/oxygen barrier conductive layer and the first circuit pattern layer;
forming a sensing circuit layer on the first water/oxygen barrier layer; and
forming a second water/oxygen barrier layer on the sensing circuit layer.

25. The fabricating method as claimed in claim 24, wherein a method of forming the sensing circuit layer comprises:
forming a second water/oxygen barrier conductive layer on the first water/oxygen barrier insulation layer; and
forming a second circuit pattern layer on the first water/oxygen barrier insulation layer, the second circuit pattern layer connecting the second water/oxygen barrier conductive layer.

26. The fabricating method as claimed in claim 25, wherein a method of forming the first circuit pattern layer and the second circuit pattern layer comprises performing a screen printing process, an ink jet printing process, a photolithography and etching process, or a sputtering process.

27. A fabricating method of a touch-sensing display apparatus, comprising:
forming an organic light emitting diode display layer on a substrate, wherein a method of forming the organic light emitting diode display layer comprises:
forming an active array device on the substrate;
forming a pair of electrode layers on the substrate, wherein the active array device is covered by the pair of electrode layers;
forming an organic light emitting layer between the pair of electrode layers; and
forming the first water/oxygen barrier layer on the pair of electrode layers;
forming a first water/oxygen barrier layer on the organic light emitting diode display layer; and
forming a touch structure on the organic light emitting diode display layer, wherein a method of forming the touch structure comprises:
forming an electromagnetic interference shielding layer on the first water/oxygen barrier layer, wherein a method of forming the electromagnetic interference shielding layer comprises:
forming a first water/oxygen barrier conductive layer on the first water/oxygen barrier layer and electrically connecting the first water/oxygen barrier conductive layer to a first conductive wire located on the substrate; and forming a first water/oxygen barrier insulation layer on the first water/oxygen barrier conductive layer
forming a sensing circuit layer on the first water/oxygen barrier layer; and
forming a second water/oxygen barrier layer on the sensing circuit layer.

28. The fabricating method as claimed in claim 27, wherein a method of forming the second water/oxygen barrier layer comprises performing an electron beam evaporation process, a sputtering process, a spin coating process, a dipping process, a spray process, a flow coating process, an ink jet printing process, or a chemical vapor deposition process.

29. The fabricating method as claimed in claim 27, wherein a method of forming the sensing circuit layer comprises:
  forming a first patterned conductive layer on the first water/oxygen barrier insulation layer and electrically connecting the first patterned conductive layer to a second conductive wire located on the substrate;
  forming a second water/oxygen barrier insulation layer on the first patterned conductive layer; and
  forming a second patterned conductive layer on the second water/oxygen barrier insulation layer and electrically connecting the second patterned conductive layer to a third conductive wire located on the substrate.

30. The fabricating method as claimed in claim 29, wherein a method of forming the first patterned conductive layer and the second patterned conductive layer comprises:
  forming a plurality of first touch electrode series on the first water/oxygen barrier insulation layer, wherein the first touch electrode series extend along a first direction, and each of the first touch electrode series comprises a plurality of first touch pads electrically connected to one another; and
  forming a plurality of second touch electrode series on the second water/oxygen barrier insulation layer, wherein the second touch electrode series extend along a second direction, each of the second touch electrode series comprises a plurality of second touch pads electrically connected to one another, and the first direction is different from the second direction.

31. The fabricating method as claimed in claim 30, wherein a method of forming the first touch electrode series and the second touch electrode series comprises performing a spin coating process, a laser etching process, a photolithography and etching process, or a sputtering process.

32. The fabricating method as claimed in claim 27, wherein a method of forming the sensing circuit layer comprises:
  forming a third patterned conductive layer and a fourth patterned conductive layer on the first water/oxygen barrier insulation layer and connecting the third patterned conductive layer to a second conductive wire located on the active array device, wherein the fourth patterned conductive layer is connected to a third conductive wire located on the active array device; and
  forming a second water/oxygen barrier insulation layer on the third patterned conductive layer and the fourth patterned conductive layer and forming a plurality of holes on the second water/oxygen barrier insulation layer.

33. The fabricating method as claimed in claim 32, wherein a method of forming the third patterned conductive layer and the fourth patterned conductive layer comprises:
  forming a plurality of third touch electrode series, wherein the third touch electrode series extend along a third direction, and each of the third touch electrode series comprises a plurality of third touch pads electrically connected to one another; and
  forming a plurality of fourth touch electrode series, wherein the fourth touch electrode series extend along a fourth direction, each of the fourth touch electrode series comprises a plurality of fourth touch pads electrically connected to one another, and the third direction is different from the fourth direction.

34. The fabricating method as claimed in claim 33, further comprising forming a bridge conductive wire on the holes on the second water/oxygen barrier insulation layer to connect the fourth touch pads.

35. The fabricating method as claimed in claim 32, wherein a method of forming the third patterned conductive layer and the fourth patterned conductive layer comprises performing a screen printing process, an ink jet printing process, a photolithography and etching process, or a sputtering process.

36. The fabricating method as claimed in claim 32, wherein a method of forming the holes on the second water/oxygen barrier insulation layer comprises simultaneously forming the second water/oxygen barrier insulation layer and the holes.

37. The fabricating method as claimed in claim 34, wherein a method of forming the bridge conductive wire comprises performing a screen printing process, an ink jet printing process, a photolithography and etching process, or a sputtering process.

38. The fabricating method as claimed in claim 24, wherein a method of forming the second water/oxygen barrier layer comprises performing an electron beam evaporation process, a sputtering process, a spin coating process, a dipping process, a spray process, a flow coating process, an ink jet printing process, or a chemical vapor deposition process.

* * * * *